(12) United States Patent
Newcomb et al.

(10) Patent No.: US 6,372,098 B1
(45) Date of Patent: Apr. 16, 2002

(54) HIGH TARGET UTILIZATION MAGNET ARRAY AND ASSOCIATED METHODS

(75) Inventors: Richard L. Newcomb; Hans Peter Theodorus Ceelen, both of Rio Vista, CA (US)

(73) Assignee: The BOC Group, Inc., Murray Hill, NJ (US)

(*) Notice: Subject to any disclaimer, the term of this patent is extended or adjusted under 35 U.S.C. 154(b) by 0 days.

(21) Appl. No.: 09/670,909

(22) Filed: Sep. 28, 2000

(51) Int. Cl.$^7$ ............................................. C23C 14/35
(52) U.S. Cl. ......................... 204/192.12; 204/298.17; 204/298.19
(58) Field of Search ...................... 204/192.12, 298.17, 204/298.19, 298.16, 298.21

(56) References Cited

U.S. PATENT DOCUMENTS

| | | | |
|---|---|---|---|
| 4,461,688 A | * 7/1984 | Morrision, Jr. | 204/192 R |
| 4,971,674 A | 11/1990 | Hata | 204/192.12 |
| 5,262,028 A | 11/1993 | Manley | 204/192.12 |
| 5,415,754 A | * 5/1995 | Manley | 204/192.12 |
| 5,597,459 A | 1/1997 | Altshuler | 204/192.12 |
| 5,736,019 A | 4/1998 | Bernick | 204/298.07 |
| 5,744,011 A | 4/1998 | Okubo et al. | 204/192.12 |
| 5,865,970 A | 2/1999 | Stelter | 204/298.19 |
| 5,980,707 A | 11/1999 | Manley | 204/298.2 |

FOREIGN PATENT DOCUMENTS

JP 57-207173 12/1982 ............ C23C/15/00

OTHER PUBLICATIONS

Abstract portion only for a transcript of a presentation by R.L. Newcomb at the "Proceedings of the 3$^{rd}$ International Conference on Coatings on Glass", Oct. 29–Nov. 2, 2000, Maastricht, The Netherlands, said Abstract believed to have been submitted at some unknown date prior to Oct. 30, 2000.

Transcript of presentation by R.L. Newcomb at the "Proceedings of the 3$^{rd}$ International Conference on Coatings on Glass", Oct. 29–Nov. 2, 2000, Maastricht, The Netherlands, believed to have been presented on Oct. 30, 2000.

R.L. Newcomb, "Advance in target utilization for planar magnetrons", as published for the "Proceedings of the 3$^{rd}$ International Conference on Coatings on Glass", Oct. 29–Nov. 2, 2000, Maastricht.

Newcomb, R.L. (2000) "Advances in Target Utilization for Planar Magnetrons" Transcript of presentation made by author at BOC Coating Technology, 5 pgs.

\* cited by examiner

*Primary Examiner*—Nam Nguyen
*Assistant Examiner*—Steven H. Ver Steeg
(74) *Attorney, Agent, or Firm*—Philip H. Von Neida; Salvatore P. Pace

(57) ABSTRACT

An arrangement of magnets and stacks of magnets has been developed for use in magnetron sputtering devices. The arrangement may include commercially available or easily manufactured magnets. The arrangement may also include magnetic shunts to tune the magnetic field. The arrangements may be potted to provide protection from the environment, and may be incorporated into a system for cooling the magnets and target. When used in a magnetron sputtering device, the arrangement provides a magnetic field that results in nearly uniform sputtering over most of the target area. Further, the magnet arrangement provides target utilization values that are significantly higher than those provided by prior art magnet systems. Thus, the present invention also provides a method of arranging magnets for optimal performance and a method for improving target utilization.

23 Claims, 9 Drawing Sheets

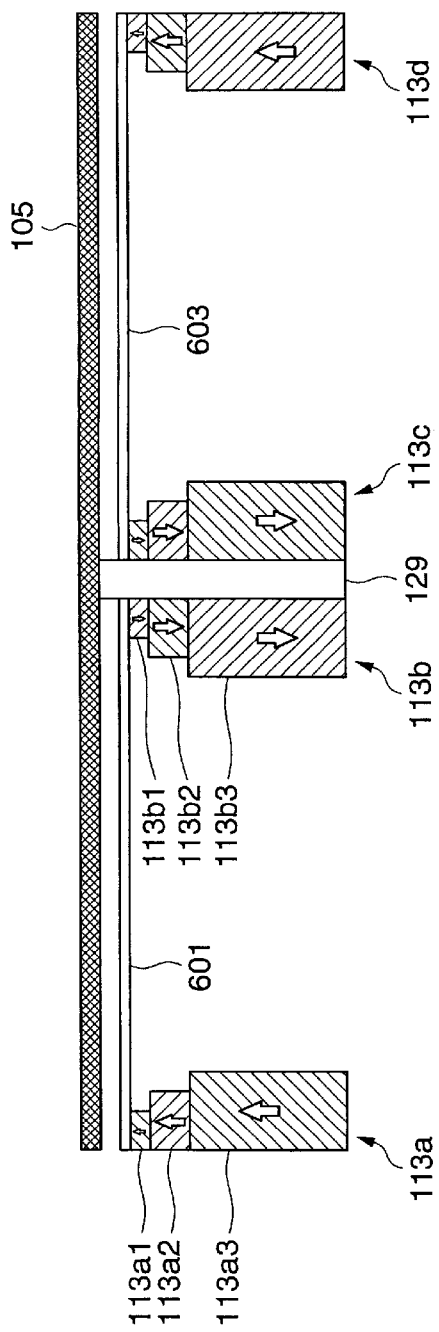
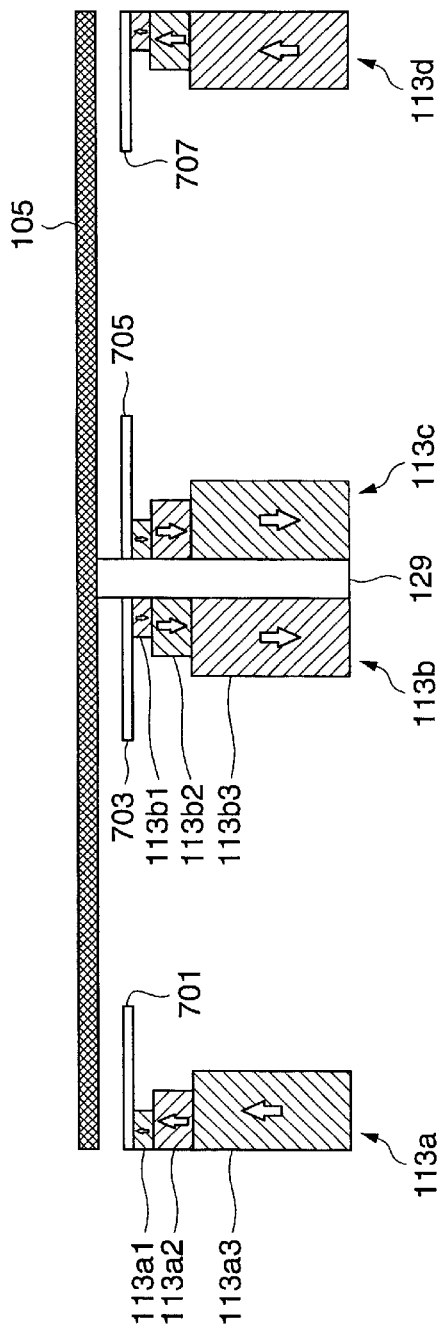

HIGH TARGET UTILIZATION MAGNET ARRAY AND ASSOCIATED METHODS

FIELD OF THE INVENTION

The present invention is related to the field of magnetron sputtering. More specifically, the present invention is directed to methods and systems for providing magnetic fields within a magnetron sputtering device to achieve high target utilization.

BACKGROUND OF THE INVENTION

Magnetron sputtering is a technique for coating objects that generates a stream of coating material by sputtering a target through the use of a plasma discharge. Sputtering is a process in which material is dislodged from the surface of a material by collision with high-energy particles. In magnetron sputtering devices, high-energy particles in the form of plasma ions are directed towards the target under the action of an imposed magnetic field. Sputtering is controllable through the proper application of plasma parameters, such as pressure, power, and gas, and a magnetic field, which may also be controllable. In vacuum, the sputtered materials travel from the magnetron toward one or more workpieces and adhere to the workpiece surface. Through the judicious choice of plasma gases, magnetic design and physical layout, a wide variety of materials, including metals, semiconductors and refractory materials, can be sputtered to desired specifications. Magnetron sputtering has thus found acceptance in a variety of applications including semiconductor processing, optical coatings, food packaging, magnetic recording, and protective wear coatings.

Commonly used magnetron sputtering devices include a power supply for depositing energy into a gas to strike and maintain a plasma, magnetic elements for controlling the motion of ions, targets for generating coating material through sputtering by the plasma, and provisions for mounting or holding one or more workpieces for coating. Sputtering is accomplished with a wide variety of devices having differing electrical, magnetic, and mechanical configurations. The configurations include: various types of electrodes, one of which may be the target; sources of DC or AC electromagnetic fields or radio frequency energy to produce the plasma; and permanent magnets, electromagnets or some combination thereof to direct the ions. In addition, the vacuum chamber is connected to a vacuum pump and a gas supply for controlling the environment within the chamber. Target materials used with DC or mid-frequency AC sputtering are chosen from conductive elements or alloys which form conductive materials, such as metals, metal oxides and ceramics, and typically include, but are not limited to, silver, tin, zinc, titanium, chromium, or indium. Non-conductive materials may be sputtered using RF sputtering methods.

In practice, a plasma is struck within the vacuum chamber, and magnetic fields are used to accelerate ions in a plasma onto a target, thus enhancing sputtering from the target. In addition to sputtering the target, ion bombardment heats the target and other components. The performance of electrodes, magnetic elements and targets may be improved when the various components are cooled. This cooling helps to control temperature dependent material properties that might alter or degrade the magnetic field and also increases the stability and lifetime of components. When properly maintained, the electrodes and magnetic elements generally have long lifetimes, on the order of a decade or more. The targets must be replaced when new materials are to be sputtered, or when sputtering has reduced the thickness of the target to depletion or unacceptable levels. Thus the magnetic elements have relatively low maintenance requirements as compared to the target, which must be replaced at regular intervals during normal use.

The location and strength of magnetic fields, especially adjacent to the target surfaces, have great practical importance in magnetron sputtering devices. It is well known in the art that the interaction between the change in shape of the sputtered surface and the magnetic field over the target surface results in an acceleration of sputtering at locations where sputtering has begun. Thus it is common for targets to erode rapidly at certain locations, leaving other locations relatively uneroded. The faster the sputtering, the quicker the thickness of the target is eroded. As a result, a target with increased thickness is sometimes used to prolong the target lifetime. The increased thickness may increase the amount of material available for sputtering, but can adversely affect the total percentage of target material consumed during sputtering. The fraction of target material consumed during sputtering before the target must be replaced is sometimes called the "target utilization." Utilization is greatly affected by the maximum rate of sputtering which may be concentrated in a focused region of the target surface. Even if the average sputtering rate over the surface is small, the peak sputtering rate at a particular target location can limit the total amount of time before the target must be replaced. Thus, sputtering uniformly across the entire target surface over the target lifetime can maximize utilization.

One example of a prior art magnetron is shown in FIG. 5. The side view of FIG. 5 is a representative cross section of a target 503, including an initial front surface 507 and a back surface 505, and a horseshoe magnet 501 as used in a planar magnetron sputtering device. The magnetic poles (N and S) and magnetic field lines (dotted lines) at an initial front surface 507 are also shown. Also shown is a sputtered front surface 507'. During use, the target surface undergoes a loss or erosion of material due to sputtering which modifies the surface shape from initial front surface 507 to sputtered front surface 507'. The change in shape of front surface 507 can affect the strength of the magnetic field at the target surface, especially for a non-magnetic target material, resulting in a change in the location of further sputtering. With sputtering faster at the center than at the edge, prior art target utilization tends to be low. Utilization in many prior art magnetron sputtering devices is in the range of 17–25%

Magnets used to control sputtering and increase target utilization and lifetime are generally designed through an iterative process to select the proper size, shape, strength, and location of the magnets. Cooling requirements for the target or magnet may put further restraints on the size, material, and shape of the magnets. Obtaining an optimal design usually involves the modeling and prediction of the optimum design followed by the deposition of a number of workpieces under a variety of conditions to optimize the magnetic field. Existing magnets impose some restrictions that make design optimization difficult. For example, Bernick (U.S. Pat. No. 5,736,019, issued Apr. 7, 1998) discloses a magnet design that provides improved target utilization in some cases. While the Bernick design is an improvement over some prior art systems it incorporates tapered magnets which are expensive, difficult to cool, difficult to manufacture, and provides limited means for tuning. This complexity adds to the cost of optimizing and of manufacturing the final product. Further by way of example, Manley (U.S. Pat. No. 5,262,028) addresses the need to provide improved magnetic fields by including magnets of differing magnetic orientation, with some poles oriented parallel and other poles oriented perpendicular to the target. While this combination of magnets does allow for some modification of the magnetic field at the portion of the target being sputtered, it requires a large number of magnets, and either a further increase in the magnetic field or a decrease in the desired thickness of the target.

There is a need in the art of magnetron sputtering devices for method and an apparatus that provides higher target utilization than that associated with prior art devices. In addition, there is a need for a magnet assembly having a small number of magnets, sized and shaped for easy manufacture and assembly. There is also a need for magnets that are easily protected from the working environment and that can be cooled.

BRIEF SUMMARY OF THE INVENTION

The present invention provides arrangements and methods of arranging magnets for use in magnetron sputtering devices. Typically, magnets induce magnetic field variations across the target, resulting in variations of sputtering rate. The arrangement of magnets can thus have an effect on the fraction of target material consumed during sputtering, or target utilization. Although some prior art magnets have been designed to improve target utilization, many of these include shapes, configurations or orientations that are unsuitable for effectively producing high target utilization. The arrangement of magnets of the invention and the inclusion of shunts, if needed, overcomes many of the previously described difficulties of the prior art. The use of the magnets of the invention in a magnetron sputtering device results in greater target utilization than that associated with the prior art. In particular, the present invention provides magnets that can be easily arranged to produce magnetic fields that improve target utilization. For example, while a utilization of 17–25% is common in the prior art, the present invention can provide utilization in the range of about 35–45%, with a typical value of about 40%. Increased target utilization results in a longer target lifetime, and thus has the benefit of decreased maintenance costs and operational downtime.

According to a particular aspect of the invention, magnets are arranged in groupings, or stacks, with the magnetic orientation perpendicular to the target. In one embodiment, magnets of various sizes and strengths are used to produce a closed-loop magnetic tunnel adjacent to the target. Improvements in target utilization are achieved by tuning the magnetic field according to the placement, relative to the target, of a small number of magnets. By producing a magnetic field distribution across the target that provides for a more uniform sputtering, the present invention provides a more uniform use of the target and a higher utilization. Specifically, the invention provides relatively higher fields at the edges of the target to increase sputtering rate and provides relatively lower fields in the center of the target to decrease sputtering rate. According to one aspect of the invention, magnetic fields are obtained by stacking magnets of rectangular cross-section having one side parallel to the target. According to another particular aspect of the invention, stacked magnets are provided with electrodes to produce a plasma in a magnetron sputtering device.

According to another particular aspect of the invention, magnetic fields are obtained by including shunts to modify the magnetic field at the target, either by locating the shunts between the stacks and the target to lower the magnetic field at the target, or by locating the shunts near the base or outer sides of the magnets to boost the magnetic field at the target. In one embodiment, magnets having rectangular cross-sections are stacked with one side parallel to the target, allowing for the easy placement of magnetic shunts. Specifically, shunts may be placed along stacks, across stacks, or may partially fill the space between stacks and target. This arrangement allows for the placement of shunts to tune the magnetic field, and thus improve target utilization.

According to another aspect of the invention, the stacks can be coated and/or potted to both restrain and protect the magnets from the cooling medium of the magnetron-sputtering environment or the gas within the vacuum environment. Several arrangements of magnets may be tested to optimize target utilization, and an acceptable arrangement can be potted. The potted arrangement may be incorporated into a cooling system to maintain acceptable magnet, shunt and target temperatures.

According to yet another particular aspect of the invention, a method is provided for arranging magnets in stacks to improve target utilization. The method allows for the inclusion of shunts that are used to tune the magnetic field for the purpose of optimizing target utilization and improvement of the uniformity of the sputtered film.

A further understanding of the invention can be had from the detailed discussion of specific embodiments below. For purposes of clarity, the invention is described in terms of systems that include many different innovative components and innovative combinations of components. No inference should be made to limit the invention to combinations containing all of the innovative components listed in any illustrative embodiment in this specification.

All patents cited herein are hereby incorporated by reference in their entireties for all purposes. Additional objects, advantages, aspects and features of the present invention will become apparent from the description of preferred embodiments, set forth below, which should be taken in conjunction with the accompanying drawings, a brief description of which follows.

BRIEF DESCRIPTION OF THE DRAWINGS

The invention will be better understood by reference to the FIGS. 1 through 16, which are briefly described below.

FIG. 6 is a side view of four, three-magnet stacks with a top shunt in accordance with a second embodiment of the present invention.

FIG. 7 is a side view of four, three-magnet stacks having two top, partial shunts in accordance with a third embodiment of the present invention.

Reference symbols are used in the Figures to indicate certain components, aspects or features shown therein, with reference symbols common to more than one Figure indicating like components, aspects or features shown therein. The reference symbols used herein are not to be confused with any reference symbols used in the items that have been incorporated herein by reference.

DETAILED DESCRIPTION OF THE INVENTION

The present invention relates to an arrangement of magnets for use in a magnetron sputtering device that provides for more uniform target sputtering. Merely by way of convenience, the invention is described in terms of planar and circular arrangements of magnets. It will be understood to those of skill in the art that the invention is also applicable to other electrode configurations.

Figure 1:
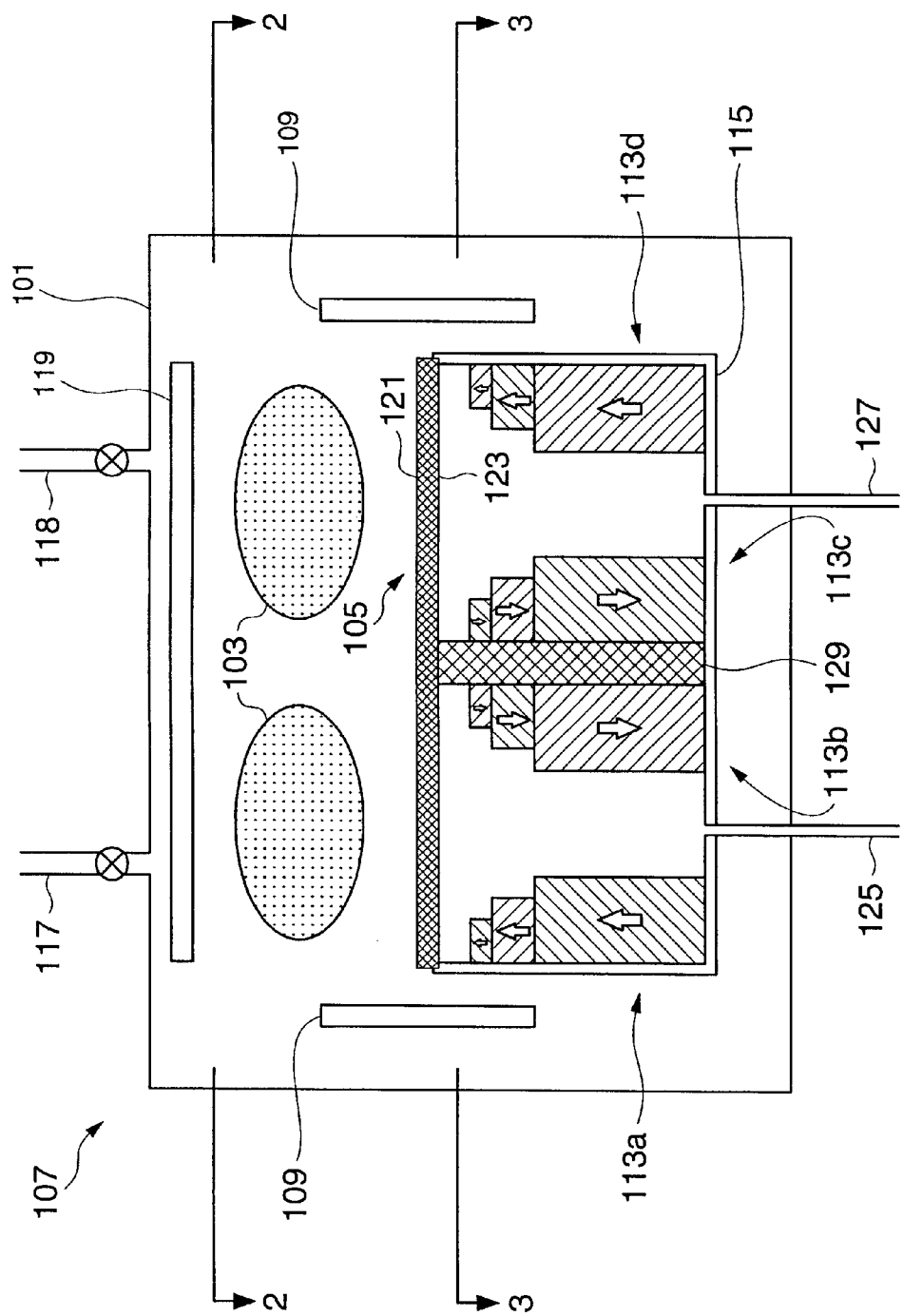
FIG. 1 is a side view of a first embodiment of a planar magnetron sputtering device of the present invention showing the interior of the device.
Figure 2:
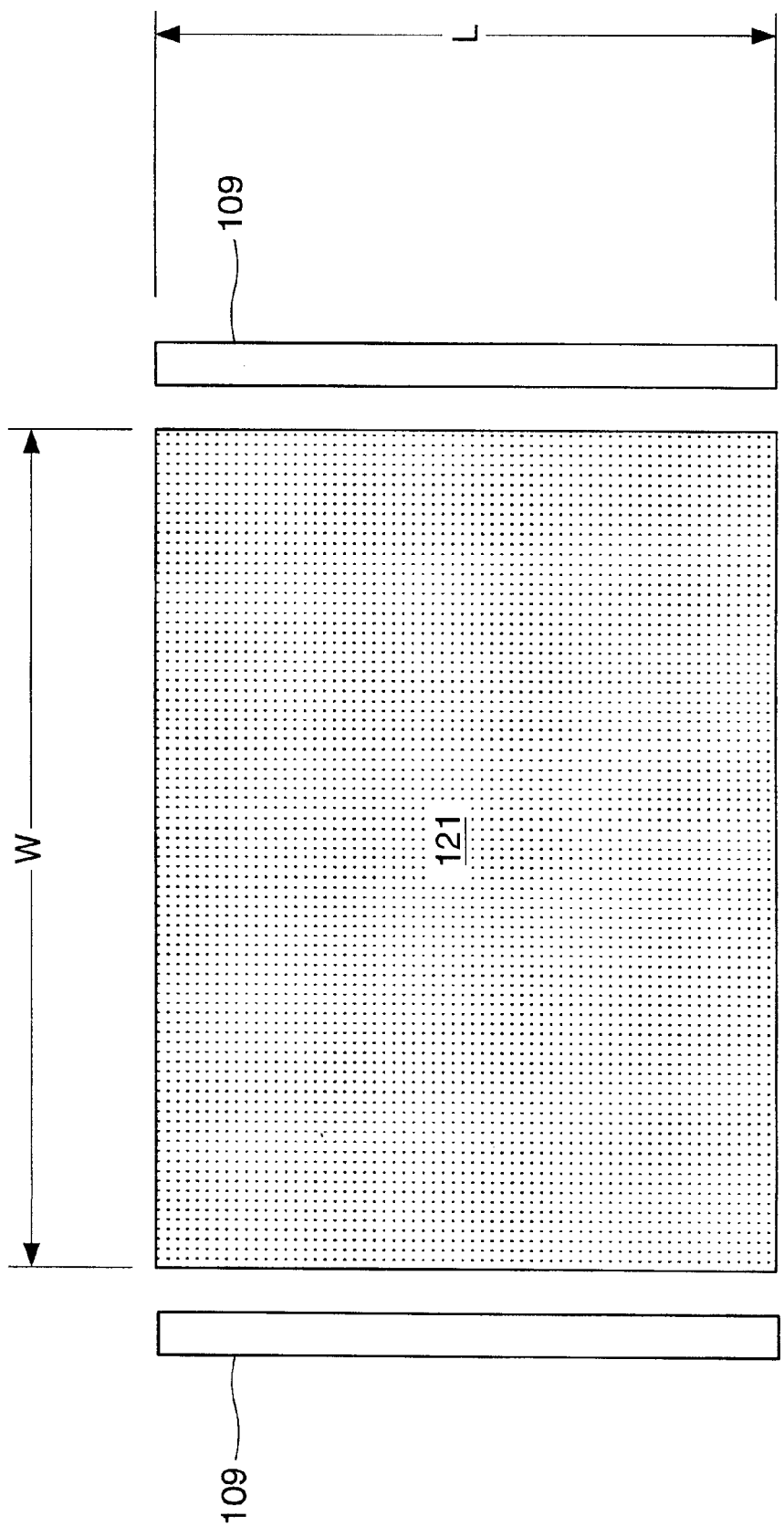
FIG. 2 is a cross-sectional top view taken from FIG. 1 that shows the relative arrangement of the anode and the target in a section below the workpiece.
Figure 3:
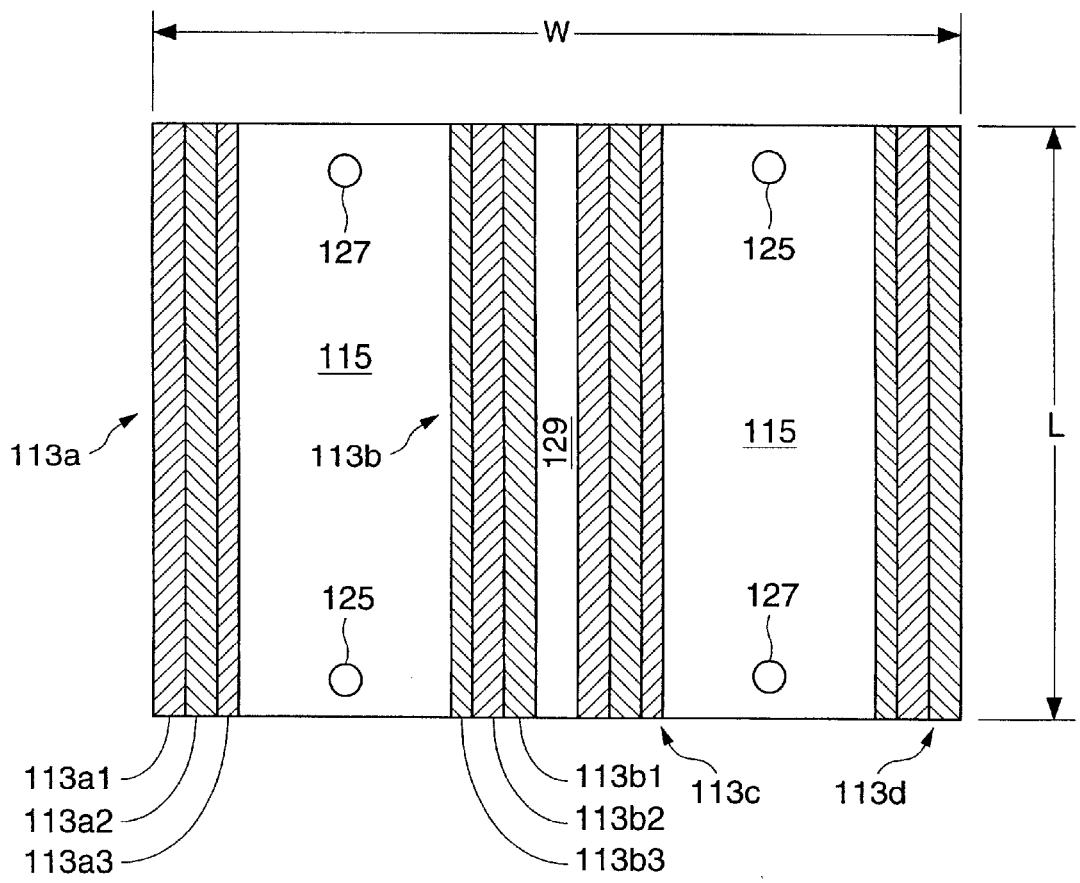
FIG. 3 is a cross-sectional top view taken from FIG. 1 that shows the planar arrangement of magnets and shunts in a section below the target.

Magnets of the present invention are incorporated into magnetron sputtering devices as shown, for example, in FIGS. 1 through 3. Specifically, FIG. 1 is a side view of first embodiment of a planar magnetron sputtering device 107 of the present invention showing the interior of the device. The magnetron 107 includes a vacuum chamber 101, electrical and magnetic components including anodes 109 and four magnet stacks 113a through 113d, a magnetron sputtering target 105 having a front surface 121 for sputtering and a back surface 123, and a workpiece 119 having an exposed surface that becomes coated by material sputtered from the front surface. The vacuum chamber 101 has at least one pumping inlet 117 for creating a vacuum within the vacuum chamber 101, and at least one gas inlet 118 for providing chamber gases at a specified pressure, and provisions for isolating the chamber or otherwise controlling the flow of gases through valves. A magnet enclosure 115 surrounds the magnets 113, has a center island 129 to provide support to the target 105, and has at least one cooling water inlet 125 and outlet 127 to cool the magnets and the target. The magnet enclosure 115 supports the target 105 along the edges and may also incorporate an o-ring to seal the water-cooled magnet cavity from the vacuum sputtering environment. Many larger magnetron sputtering devices include a target that is too large to be edge supported, and thus include a center island, such as the center island 129, for additional support. The invention is not limited to magnetron sputtering devices having center islands, as shown in several of the subsequent embodiments.

The target 105 has a width W and a length L as seen in the top views of FIGS. 2 and 3. The stacks 113a through 113d have approximately the same length L as the target 105, are parallel, and are spaced by approximately the width W of the target. The anodes 109 are approximately the same length L as the target 105, and are spaced slightly greater than the width W of the target. The magnets 113 are arranged in four stacks 113a through 113d which are each, according to the first embodiment of the present invention, comprised of individual magnets such as 113a1–113a3 and 113b1–113b3, respectively, that are aligned perpendicular to the target 105. Each of the magnets 113 has approximately the same length L as the target 105. Arrows within each of the magnets 113 indicate the orientation of the magnetic north pole. While the magnets 113 may have differing sizes and energy products, their poles are perpendicular to the target 105.

As shown in FIG. 1, the cross-sections of the magnets 113 are approximately rectangular in the plane perpendicular to the target 105, with each edge of the cross-section oriented either parallel or perpendicular to the target. The top of each stack 113a–d is located at or near the target 105. Each stack 113a–d has a base opposite the top that is on or near the bottom of the magnet enclosure 115. The rectangular cross-section and orientation relative to the target allow for easy stacking and arrangement of the magnets relative to the front surface 121. The magnets are arranged about the center of width W. In general, the present invention provides magnetic elements with physical dimensions, positions, and magnetic orientations that are symmetric about the width of a target. The symmetry of the magnetic components results in symmetric sputtering across the width of the target. Thus for the first embodiment, the size and position of individual magnets in stacks 113a and 113d are mirror images of each other, as are those in stacks 113b and 113c. The magnetic orientation of the symmetric stacks alternate to provide symmetry sputter rate across the target 105.

In operation as a sputtering device, the vacuum chamber 101 is supplied with workpiece 119 and process gases through inlet 118 while being evacuated through the pumping inlet 117. Access to the magnetron 107 for inserting and removing the workpiece 119 is provided through a load-lock (not shown) or other openings in the magnetron. Process gases include, but are not limited to, chemically inert gases, such as argon, or reactive gases, such as oxygen or nitrogen. Typical chamber pressures range from about 1 to 5 mTorr, and are preferably from 2.5 to 3 mTorr. After providing the process gases at the proper pressure, power is supplied through conventional electronics (not shown), both to the anodes 109 and the target 121 to produce a plasma 103 adjacent to the front surface 121. Typical plasma powers range from about 5 kW to about 120 kW.

The plasma 103 contains electrically charged species that are naturally attracted or repulsed by anodes and cathodes depending on their charge. In addition to this motion, the magnetic field of the magnets 113 induces additional forces and motions within the plasma Advantageously, the electrical and magnetic components in the magnetron 107, including but not limited to magnets 113, anode 109 and shunts (not shown), can be controlled to improve the uniformity of sputtering of the front surface 121. Shunts may fully span the width between magnets (full shunts) or partially span the distance between stacks (partial shunts), either near the top, near the base, or at other locations relative to the magnets.

FIGS. 2 and 3 show sectional views as indicated in FIG. 1. Specifically, FIG. 2 is a cross-sectional top view taken from FIG. 1 that shows the relative arrangement of the anode and the target in a section below the workpiece. FIG. 3 is a cross-sectional top view taken from FIG. 1 that shows the planar arrangement of magnets and shunts in a section below the target. The target 105 is of a substantially rectangular shape, as seen in the top view of FIGS. 2 and 3, with the stacks 113a through 113d and the anodes 109 extending the length L of the target. This arrangement of electrodes provides a plasma that approximately fills the volume bounded by the electrodes. Magnetron 107 is termed "planar" as many of the components as well as the plasma therein have a substantially two-dimensional layout along the length dimension, as seen in FIGS. 1 through 3.

Figure 4:
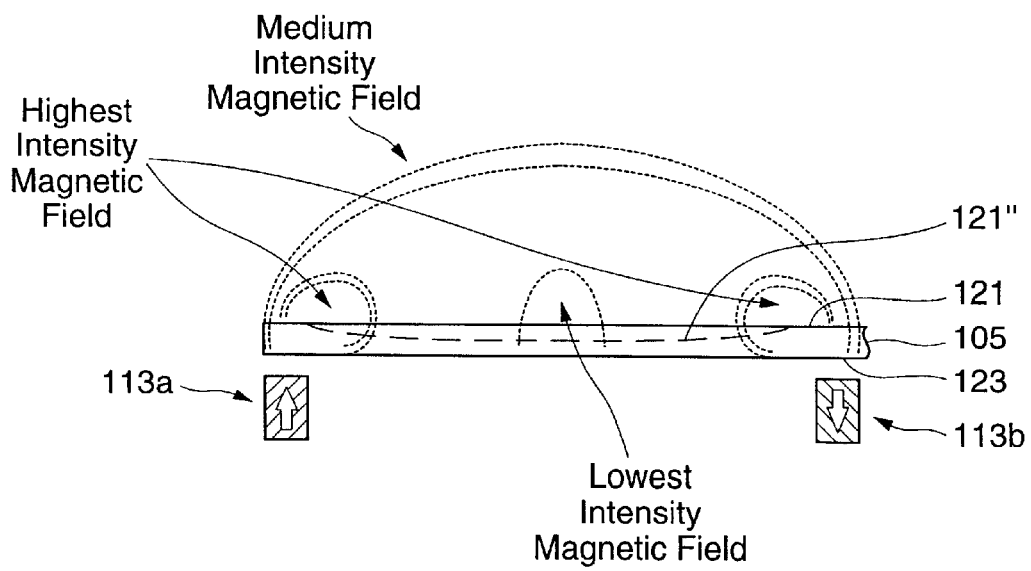
FIG. 4 is a side view of one half of the width of the magnetic arrangement, showing the magnetic field lines having closed-loop magnetic tunnel configuration produced within and near the target.

FIG. 4 is a side view of one half of the width of the magnetic arrangement, showing the magnetic field lines having closed-loop magnetic tunnel configuration produced within and near the target according to all of the embodiments of the present invention. The magnetic field lines interact with the plasma 103 causing bombardment of the front surface 121 by high-energy ions, and the resulting physical removal, or sputtering, of target material from the front surface. The closed-loop magnetic tunnel effectively traps charged particles near the front surface 121, increasing the rate of sputtering. As the front surface 121 sputters, the shape changes to sputtered target front surface 121". The present invention provides the magnetic fields shown in FIG. 4 and achieves high utilization by providing for nearly uniform sputtering over most of the target 105 throughout the lifetime of the target. It may be necessary to cool the magnets 113 during normal operation because high-energy ion bombardment of the target combined with the poor energy dissipation of the vacuum environment can generate very high temperatures. The groupings of magnets allow for coating and/or potting of the magnets to protect them from reacting with cooling water or the vacuum environment.

Figure 5:
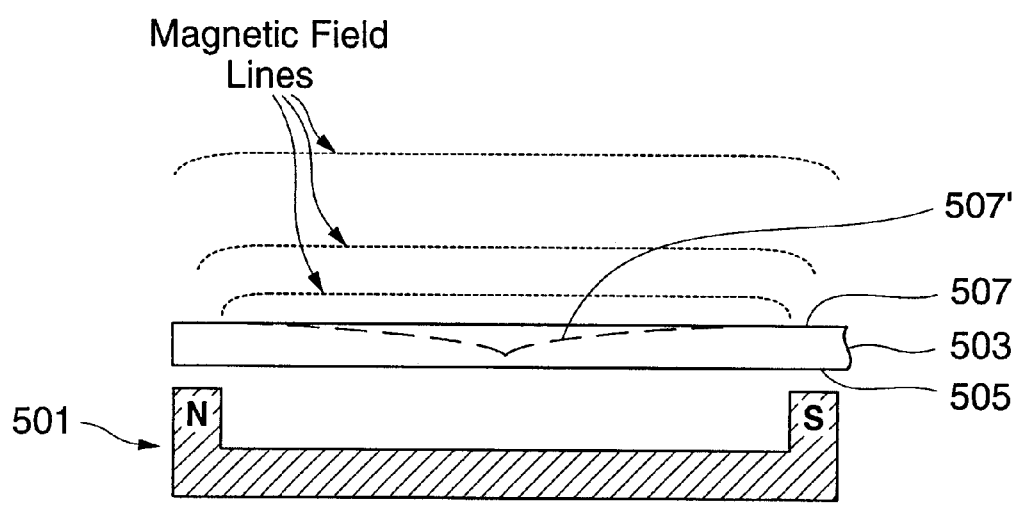
FIG. 5 is a prior art side view showing the magnetic field lines produced within and near the target.

The arrangement of magnets of the present invention eliminates much of magnetic material under the target, as compared to the prior art magnet 501 of FIG. 5. The resulting elimination of material frees up additional space beneath the target 105 and increases the exposed surface area of the magnets 113, allowing for various steps to be taken to protect and cool the magnets and target. In one embodiment, the magnets are coated with EVERSLICK™ and potted in a thermoplastic. Many such coating and potting compounds are known in the art for protecting electronic or magnetic components from environmental degradation or for holding components in place. In addition, the inventive magnets allow better access to the target backside 123, and thus make it easier to incorporate the magnets and target into an active cooling system.

The combinations of rectangular magnets and planar shunts provide for greater utilization in a manner that facilitates computer modeling, allowing optimum magnetic field strengths to be obtained inexpensively. In addition the rectangular, stacked configuration of magnets provides for easily arranging and testing various magnet designs. One goal of optimization is to determine magnetic fields that provide nearly uniform sputtering over most of the target throughout the target lifetime. An optimized magnetic field should not result in an acceleration of sputtering at previously sputtered sites, and should increase sputtering near the edges of the target near the magnets, where it is known that sputtering rates are generally the lowest.

An optimized, first embodiment magnet arrangement was obtained by computationally determining individual magnet characteristics that produce a specified magnetic field, and then testing the optimized arrangement. A spreadsheet program was developed to calculate the magnetic field near a target for specified individual magnet size, location, and energy product. Optimization calculations proceeded by determining the magnetic field for a variety of magnet sizes, locations and energy products, until a magnetic field having the features indicated in FIG. 4 was found. In particular, a magnetic field having a low strength between magnets and a high strength near magnets was expected to produce high utilization.

Figure 15:
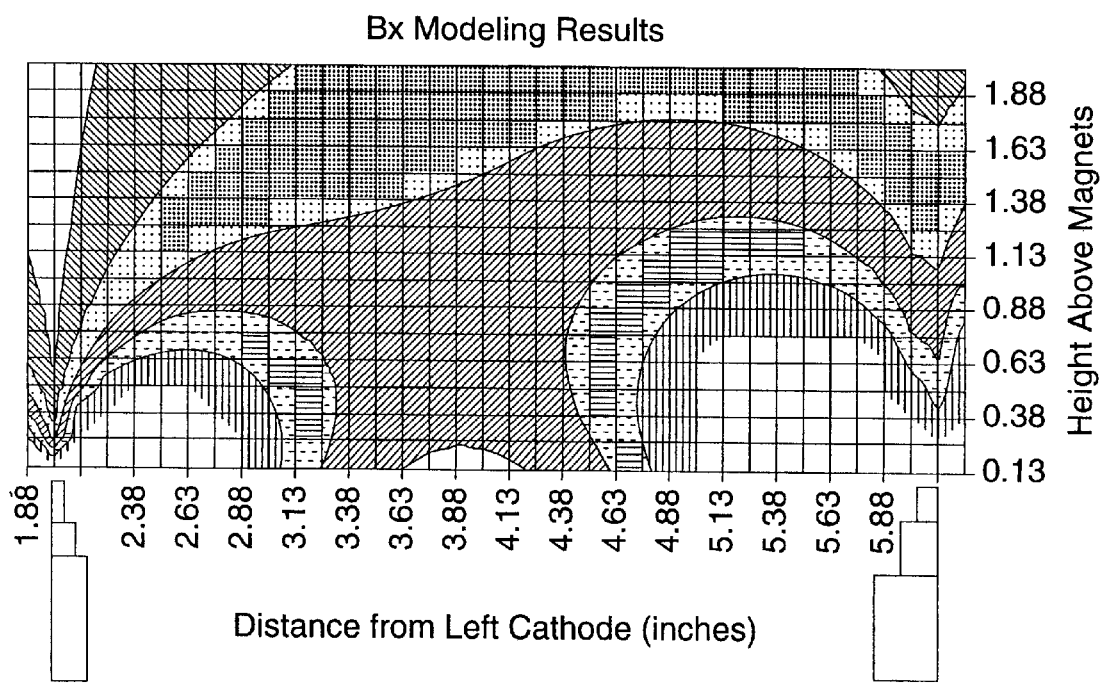
FIG. 15 is a graph the magnetic field surrounding the magnet arrangement of the first embodiment.

TABLE 1 shows the magnet size and range of energy products for two of the stacks of an optimized design of the first embodiment. FIG. 15 shows the optimized magnetic field for the TABLE 1 design. Specifically, FIG. 15 indicates the magnetic field about magnets having a specified size and energy product having the configuration of the first embodiment. As noted previously, the first embodiment has 4 stacks that are mirror images about the center island 129. The individual magnets in stack 113c mirror those in stack 113b, and the individual magnets of stack 113d mirror those of stack 113a.

TABLE 1

Optimized first embodiment sizes and range of magnet strengths, where the sizes are measured parallel to target (width) and perpendicular to the target (height).

| Magnet | Size (inches) width × height | Energy Product Range (MGO) | Preferred Energy Product Range (MGO) |
|---|---|---|---|
| 113a1 | 0.10 × 0.12 | 38–48 | 45–48 |
| 113a2 | 0.18 × 0.20 | 31–43 | 35–38 |
| 113a3 | 0.20 × 0.80 | 28–38 | 28–30 |
| 113b1 | 0.10 × 0.15 | 38–48 | 40–45 |
| 113b2 | 0.18 × 0.20 | 31–43 | 35–38 |
| 113b3 | 0.25 × 0.80 | 38–48 | 45–48 |

Figure 16:
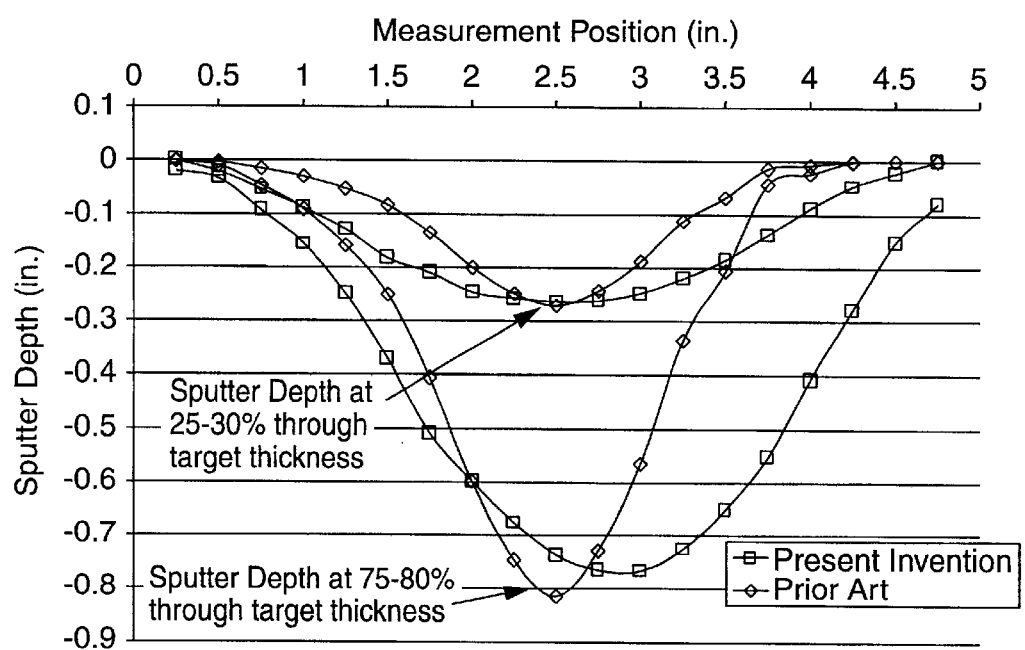
FIG. 16 is a graph of sputter target depth profiles showing improvements in utilization of the first embodiment of FIG. 1 over that of the prior art magnet of FIG. 5.

The optimized design of TABLE 1 was tested in a magnetron sputtering device having a length L of 62 inches and a width W of 10 inches, operated at a power of 40 kW in argon at 3 mTorr. For comparison, tests were also conducted on a prior art horseshoe magnet 501, as in FIG. 5. Sputter depth profiles across the target width are presented in FIG. 16 for both the optimized and prior art magnets. Profiles are shown for center erosion depths of 25–30% and of 75–80%. The improvement in utilization is evident from the increased width of the sputter depth profiles for the optimized design. The broader sputter depth profile of the present invention allows for higher target utilization before the target is sputtered to some predetermined sputter depth. Specifically, the optimized design achieves utilizations of about 35–45%. Utilizations of about 40% are typically achieved with the magnets of the present invention, with the actual utilization dependent upon the cathode size, target material, and process conditions such as power, pressure and gas type. For comparison, the target utilization range of the prior art magnet is 17–25%. The optimized design nearly doubles the amount of target material available for sputtering.

The present invention includes many possible stacked arrangements of magnets and shunts, including partial top and base shunts, to produce the magnetic fields required for high target utilization. Shunts have the advantage of improving the sputtered film thickness uniformity on the workpiece 119 over the length L. In general, shunts near the top of the stacks tend to decrease the magnetic field at the target, while shunts near the base of the stacks tend to increase the magnetic field at the target. Base or top shunts that partially span the target or spacing between stacks locally modifies the magnetic field, and thus is useful for changing the intensity of the magnetic field across the target. The method of applying a top or bottom shunt is particularly useful for tuning the sputtered thin film uniformity about the length 'L' of the magnetron. The following embodiments illustrate some of these arrangements, including planar and circular magnetron magnets, stacks arranged parallel and perpendicular to the target, and magnets having a wide range of sizes and energy products.

FIG. 6 is a side view of four, three-magnet stacks with a top shunt in accordance with a second embodiment of the present invention. Shunt 601, which may be made of nickel, steel or other magnetic materials, is positioned near the top of stacks 113a and 113b, has a width that spans the distance between stacks 113a, and 113b and a length that is approximately the same as that of the stacks. A second shunt 603 spans the distance between the tops of stacks 113c and 113d. The placement of shunts 601 and 603 between magnets 113 and target 105 lowers the magnetic field across the target, and specifically at its front surface 121. The sputter rate generally increases with magnetic field strength. Thus shunts 601 and 603 may be used to lower the magnetic field near front surface 121, and to lower the sputter rate across target 105. The rectangular shape of magnets 113 in a stacked configuration allows for the simple inclusion of shunts 601 and 603 having varying thickness and lengths. Magnetic symmetry about the center of target 105 is preserved by providing shunts 601 and 603 as well as stacks 113a through 113d that are mirror images about center island 129.

FIG. 7 is a side view of four, three-magnet stacks having two top, partial shunts in accordance with a third embodiment of the present invention. The third embodiment adds shunts to the first embodiment. Specifically, shunts 701, 703, 705 and 707 are provided as partial shunts between the tops of magnets 113 and the target 105. The presence of magnetic shunts between the stacks 113 and the target 105 lowers the magnetic field near the shunt. Thus shunts that cover part of the separation between the stacks and target are useful for changing magnetic field strength across a target. In FIG. 7, the shunts 701, 703, 705 and 707 lower the field near the edges of target 105 relative to the target center, specifically near stacks 113a through 113d. Shunts 701 and 707 thus can be used to modify, or tune, the field in the vicinity of the target to achieve a field as shown in FIG. 4. As in the second embodiment, placing the shunts 701, 703, 705 and 707 symmetrically about center island 129 preserves magnetic symmetry. Thus shunts 701 and 707 are of the same material and size, as are shunts 703 and 705.

Figure 8:
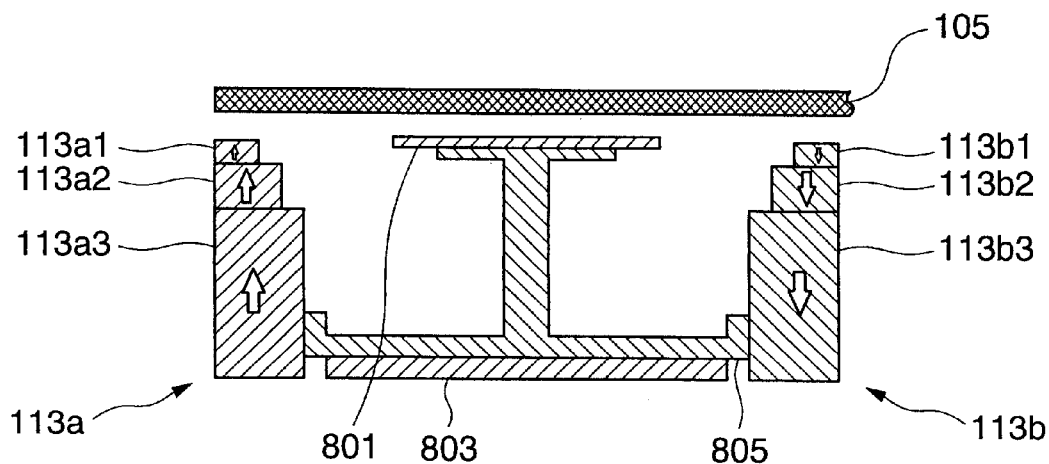
FIG. 8 is a side view of one half of the width of the magnetic arrangement, showing two, three-magnet stacks having partial top and base shunts in accordance with a fifth embodiment of the present invention.

FIG. 8 is a side view of one half of the width of the magnetic arrangement, showing two, three-magnet stacks having partial top and base shunts in accordance with a fifth embodiment of the present invention. The fifth embodiment allows for a partial top shunt 801 or a partial base shunt 803 to be held in place by a spacer 805 that locates and restrains the shunts and magnet stacks 113a and 113b. The view of the fifth embodiment is one-half of the entire assembly, with a mirror image provided opposite the center island 129. The partial top shunt 801 reduces the magnetic field intensity from the center to the edge of the target 105, while the base shunt 803 boosts the magnetic field from the center to the edge of the target. The spacer 805 is aluminum or other material that will not greatly disturb the magnetic field near the target 105. The use of either shunt 801 or 803 can modify the magnetic field near the target 105 by about 5 to 10%, allowing the field produced by magnets 113 to be tuned.

Figure 9:
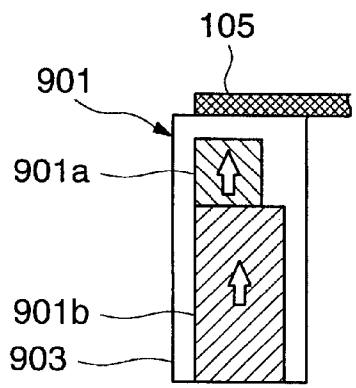
FIG. 9 is a side view of one, two-magnet potted stack in accordance with a fifth embodiment of the present invention.
Figure 10:
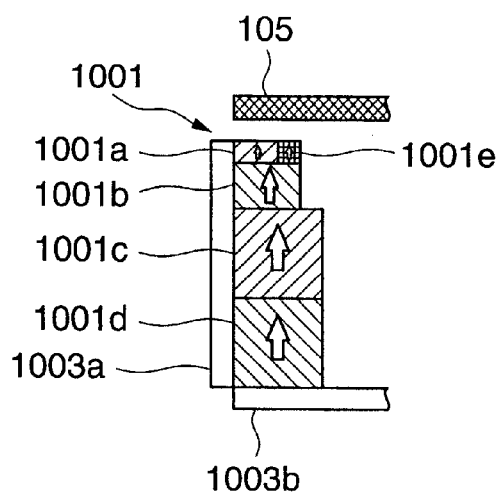
FIG. 10 is a side view of one, five-magnet stack having base and side shunts in accordance with a sixth embodiment of the present invention.
Figure 11:
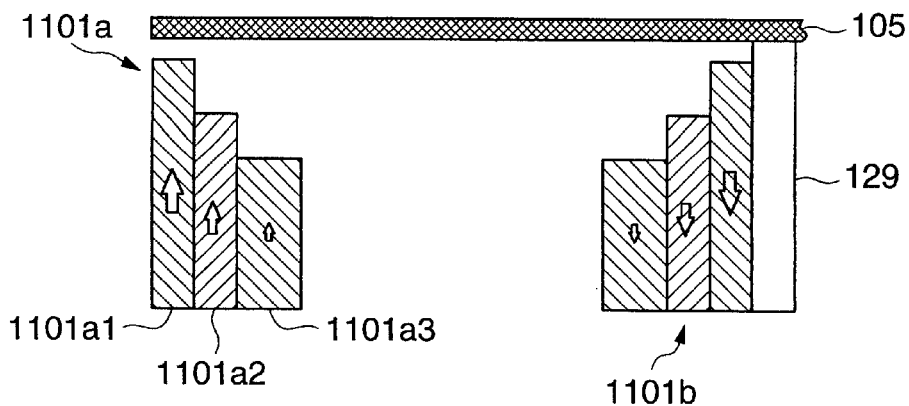
FIG. 11 is a side view of a seventh embodiment of the present invention, in which the magnets are stacked parallel to the target.

FIGS. 9–11 are side views showing only one magnet stack in various embodiments, where each stack is analogous to the one stack 113a of FIGS. 1, 4, 6 and 7. In each case the magnets and shunts are symmetrically located about the width, W, of the target 105. Each stack shown in FIGS. 9–11 has a matching, parallel stack of magnets with poles oriented in the opposite direction, as in stack 113b matching stack 113a in embodiment one through three. Each stack of FIGS. 9–11 is comprised of 2 or more magnets and may include shunts to tune the magnetic field. In each case, shunts may be fully or partially span the stacks, either near the top, near the base, or at other locations relative to the magnets. FIG. 9 is a side view of one, two-magnet potted stack in accordance with a fifth embodiment of the present invention. Magnets in the fifth embodiment include a magnet stack 901 having magnets 901a and 901b. Individual magnets 901a and 901b in stack 901 are held together with an epoxy or other potting agent 903 known to those skilled in the art. Potting stack 901 has the advantage of holding the magnets in place in a desired configuration and of protecting them from exposure to gases or cooling liquid within magnetron 107.

FIG. 10 is a side view of one, five-magnet stack having base and side shunts in accordance with a sixth embodiment of the present invention. The figure shows a stack 1001 that includes a group of five magnets, 1001a–e, a side shunt 1003a and a base shunt 1003b. Each of the magnets 1001a–e has a magnetic orientation perpendicular to the target 105. In addition, the stack 1001 is oriented perpendicularly to the target, with individual magnets 1001a–e generally arranged with ever-increasing distances from target 105. Thus for example, magnets 1001a, 1001b, 1001c and 1001d are located at progressively greater distances from target 105 along a line extending perpendicularly from the target edge. Also, Magnets 1001e, 1001b, 1001c and 1001d also form a perpendicular stack of magnets. Side shunt 1003a and base shunt 1003b may be used to restrict unwanted magnetic fields from the sides of the cathode. In general, there may be several combinations of cross-sectional area, energy product and placement that achieve high target utilization. The rectangular cross-section of magnets in stack 1001 provides magnetic fields such as those of FIG. 4 by stacking a small number of standard-sized magnets and including full shunts (as with shunt 601 of FIG. 6, for example) or partial shunts (as with shunts 701 and 703 of FIG. 7, for example).

FIG. 11 is a side view of a seventh embodiment of the present invention, in which the magnets are stacked parallel to the target. The seventh embodiment includes two stacks of magnets, 1101a and 1001b that each comprises three magnets. Thus stack 1101a has magnets 1001a1, 1001a2 and 1101a3. Each of the magnets 1001a1–3 has a magnetic orientation perpendicular to the target 105. In addition, the stacks 1001a and 1001b are arranged with individual magnets stacked side-by-side in a direction generally parallel to target 105. In this embodiment, the top of the stack is that part closest to the target 105, and the base is the part farthest from the target. The stacking results in magnets that form stacks that are oriented approximately parallel to target 105. As with the previous embodiments of perpendicularly oriented magnet stacks, this alternative arrangement of magnets also allows one to tune the magnetic field to obtain high target utilization by incorporating variations of size, spacing and energy product to provide a magnetic field as in FIG. 4.

Figure 12:
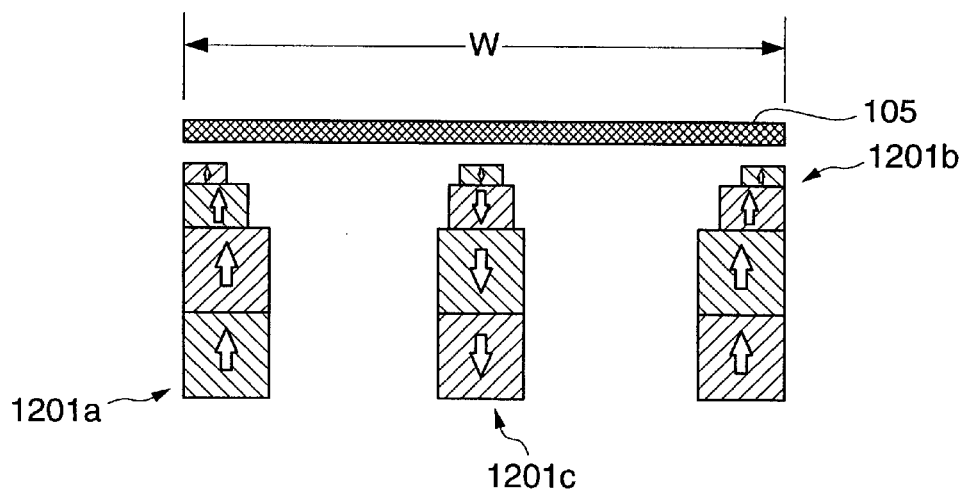
FIG. 12 is a side view of an eighth embodiment of the present invention, in which the three-magnet array stacks are arranged perpendicular to the target without a center island.

FIG. 12 is a side view of an eighth embodiment of the present invention, in which the three-magnet array stacks are arranged perpendicular to the target. Specifically, the eighth embodiment has three stacks, 1201*a*, 1201*b*, and 1201*c*, and no center island as in the center island 129 of the previous embodiments. The magnetic orientation and geometry of the magnets are symmetric about the center of width W. Thus the stacks 1201*a* and 1201*b* are mirror images about the center of target 105 and are oriented in the same direction. The center stack 1201*c* is aligned about the center of target 105. The alternating orientation of adjacent stacks across the width of target 105 provides the proper closed-loop magnetic tunnel near the target. This embodiment is particularly useful for magnetrons with electrode arrangements that allow the placement of an intermediate magnet stack. An alternative embodiment (not shown) may have other stacks with alternating magnetic orientation. Thus, for example, there may be four stacks having alternating north and south poles near the target.

Figure 13:
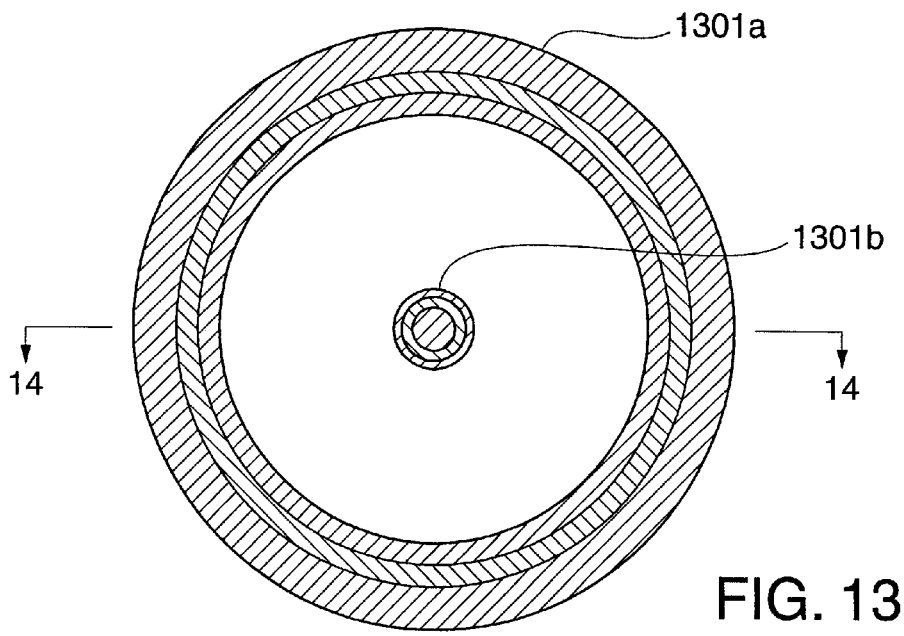
FIG. 13 is a top view of a ninth embodiment of the present invention for use with a circular target having two, circular-magnet array stacks.
Figure 14:
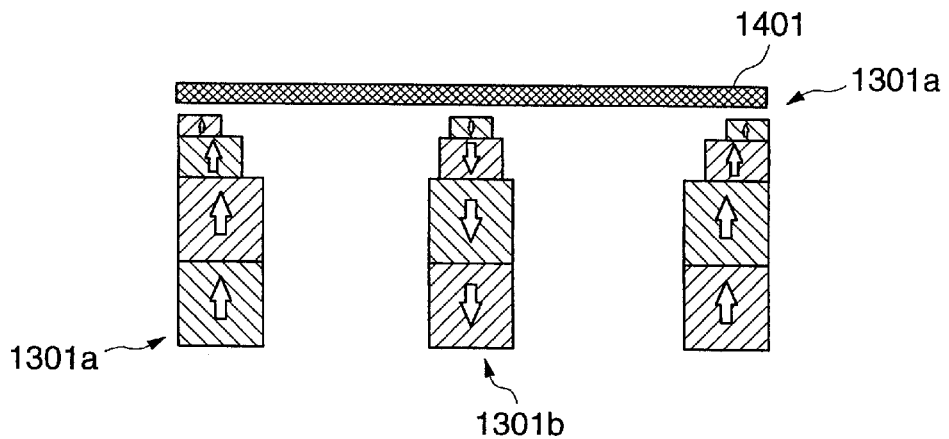
FIG. 14 is a side cross-sectional view from FIG. 13 showing the magnetic orientation, placement and size of the individual magnets.

The advantages of the present invention can be achieved with circular magnetrons as well as the previously discussed planar magnetrons, as shown in FIGS. 13 and 14. FIG. 13 is a top view of a ninth embodiment of the present invention for use with a circular target having two, circular-magnet array stacks. FIG. 14 is a side cross-sectional view from FIG. 13 showing the magnetic orientation, placement and size of the individual magnets. This embodiment includes a ring stack 1301*a*, a center stack 1301*b* and a circular target 1401. Stacks 1301 can be seen more clearly in FIG. 13, which shows a top view with circular target 1401 removed. The alternating magnetic polarity of this configuration provides for closed-loop magnetic fields similar to those shown in the planar embodiments. As with the previous embodiments, the ninth embodiment can have various combinations of magnet size, shape, position and energy density and can have shunts included to modify the magnetic field to improve target utilization. In addition, this embodiment can be used to obtain magnetic fields that provide sputtering as in FIG. 4. Alternative embodiments include potting the magnets, stacking the magnets radially, and/or including one or more additional rings of magnets, where the orientation of poles near circular target 1401 alternates between north and south radially from the center of the target.

While the invention has been described above in conjunction with preferred specific embodiments, the description and examples are intended to illustrate and not to limit the scope of the invention, which is defined by the scope of the appended claims.

It is claimed:

1. An assembly for use with a magnetron sputtering device having a target with a front surface for sputtering and a back surface, the assembly comprising:

at least one stack of at least an upper magnet disposed below the back surface and a lower magnet disposed below the upper magnet; the upper magnet and the lower magnet having a magnetic orientation substantially perpendicular to the back surface; the upper magnet and the lower magnet sufficient to form a closed-loop magnetic tunnel near the front surface; and each of the upper magnet and the lower magnet having a cross-section in a shape of an approximate rectangle of which one side is substantially parallel to the back surface and another side is substantially perpendicular to the back surface, the one side of the approximate rectangle associated with the upper magnet being shorter than the one side of the approximate rectangle associated with the lower magnet, such that the upper magnet fails to cover at least one corner of the approximate rectangle associated with the lower magnet.

2. The assembly of claim 1, further comprising at least one partial shunt sufficient to modify a magnetic field associated with the target.

3. The assembly of claim 2, wherein the at least one partial shunt is near a base of the at least one stack.

4. The assembly of claim 2, wherein the least one partial shunt is near a top of the at least one stack.

5. The assembly of claim 1, wherein the cross-section of the at least one upper magnet is less than the cross-section of the at least one lower magnet in the at least one stack.

6. The assembly of claim 1, wherein an energy product of the at least one upper magnet is less than another energy product of the at least one lower magnet in the at least one stack.

7. The assembly of claim 1, wherein an energy product of the at least one upper magnet is greater than another energy product of the at least one lower magnet in the at least one stack.

8. A magnetron sputtering device having a target with a front surface for sputtering and a back surface, the device comprising:

at least two electrodes sufficient to provide a glow discharge near the front surface; and at least one stack of at least an upper magnet disposed below the back surface and a lower magnet disposed below the upper magnet; the upper magnet and the lower magnet having a magnetic orientation substantially perpendicular to the back surface; the upper magnet and the lower magnet sufficient to form a closed-loop magnetic tunnel near the front surface; and each of the upper magnet and the lower magnet having a cross-section in a shape of an approximate rectangle of which one side is substantially parallel to the back surface and another side is substantially perpendicular to the back surface, the one side of the approximate rectangle associated with the upper magnet being shorter than the one side of the approximate rectangle associated with the lower magnet, such that the upper magnet fails to cover at least one corner of the approximate rectangle associated with the lower magnet.

9. The device of claim 8, wherein the glow discharge and the closed-loop magnetic tunnel are sufficient to provide a target utilization of greater than about 35%.

10. The device of claim 8, further comprising at least one partial shunt sufficient to modify a magnetic field associated with the target.

11. The device of claim 10, wherein the at least one partial shunt is near a base of the at least one stack.

12. The device of claim 10, wherein the at least one partial shunt is near a top of the at least one stack.

13. The device of claim 8, wherein the cross-section of the at least one upper magnet is less than the cross-section of the at least one lower magnet in the at least one stack.

14. The device of claim 8, wherein an energy product of the at least one upper magnet is less than another energy product of the at least one lower magnet in the at least one stack.

15. The device of claim 8, wherein an energy product of the at least one upper magnet is greater than another energy product of the at least one lower magnet in the at least one stack.

16. A method for use in connection with sputtering a target in a magnetron sputtering device, comprising:

providing a glow discharge near the target; and providing a closed-loop magnetic tunnel near the target via at least one stack of at least an upper magnet disposed below the target and a lower magnet disposed below the upper magnet; wherein the upper magnet and the lower magnet have a magnetic orientation substantially perpendicular to the target, and each of the upper magnet and the lower magnet has a cross-section in a shape of an approximate rectangle of which one side is substantially parallel to the target and another side is substantially perpendicular to the target, the one side of the approximate rectangle associated with the upper magnet being shorter than the one side of the approximate rectangle associated with the lower magnet, such that the upper magnet fails to cover at least one corner of the approximate rectangle associated with the lower magnet.

17. The method of claim 16, wherein the glow discharge and the closed-loop magnetic tunnel are sufficient to provide a target utilization of greater than about 35%.

18. The method of claim 16, further comprising providing at least one partial shunt sufficient to modify a magnetic field associated with the target.

19. The method of claim 18, wherein the at least one partial shunt is near a base of the at least one stack.

20. The method of claim 18, wherein the at least one partial shunt is near a top of the at least one stack.

21. The method of claim 16, wherein the cross-section of the at least one upper magnet is less than the cross-section of the at least one lower magnet in the at least one stack.

22. The method of claim 16, wherein an energy product of the at least one upper magnet is less than another energy product of the at least one lower magnet in the at least one stack.

23. The method of claim 16, wherein an energy product of the at least one upper magnet is greater than another energy product of the at least one lower magnet in the at least one stack.

* * * * *